United States Patent
Chow et al.

(10) Patent No.: US 7,295,419 B2
(45) Date of Patent: *Nov. 13, 2007

(54) NANOFIBER SURFACE BASED CAPACITORS

(75) Inventors: Calvin Y. H. Chow, Portola Valley, CA (US); Robert S. Dubrow, San Carlos, CA (US)

(73) Assignee: Nanosys, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/507,267

(22) Filed: Aug. 21, 2006

(65) Prior Publication Data

US 2006/0279905 A1    Dec. 14, 2006

Related U.S. Application Data

(63) Continuation of application No. 11/330,557, filed on Jan. 12, 2006, now Pat. No. 7,116,546, which is a continuation of application No. 11/075,361, filed on Mar. 8, 2005, now Pat. No. 7,057,881.

(60) Provisional application No. 60/554,549, filed on Mar. 18, 2004.

(51) Int. Cl.
*H01G 4/005* (2006.01)

(52) U.S. Cl. .............. 361/303; 361/302; 361/305; 361/311; 361/312; 361/313; 361/301.5; 257/295; 257/296

(58) Field of Classification Search ........ 361/502–504, 361/508–512, 516–519, 303, 305, 523, 525; 257/303, 306, 295, 296; 438/627, 643, 653
See application file for complete search history.

(56) References Cited

U.S. PATENT DOCUMENTS

| 5,196,396 | A | 3/1993 | Lieber |
| 5,252,835 | A | 10/1993 | Lieber et al. |
| 5,332,910 | A | 7/1994 | Haraguchi et al. |
| 5,505,928 | A | 4/1996 | Alivisatos et al. |
| 5,690,807 | A | 11/1997 | Clark, Jr. et al. |
| 5,751,018 | A | 5/1998 | Alivisatos et al. |
| 5,840,435 | A | 11/1998 | Lieber et al. |
| 5,897,945 | A | 4/1999 | Lieber et al. |
| 5,990,479 | A | 11/1999 | Weiss et al. |
| 5,997,832 | A | 12/1999 | Lieber et al. |
| 6,031,711 | A | 2/2000 | Tennent et al. |
| 6,036,774 | A | 3/2000 | Lieber et al. |
| 6,048,616 | A | 4/2000 | Gallagher et al. |

(Continued)

FOREIGN PATENT DOCUMENTS

WO    WO96-29629    9/1996

(Continued)

OTHER PUBLICATIONS

Bjork, M.T. et al., "One-dimensional Steeplechase for Electron Realized" Nano Letts (2002) 2:86-90.

(Continued)

*Primary Examiner*—Nguyen T. Ha
(74) *Attorney, Agent, or Firm*—Andrew L. Filler

(57) ABSTRACT

This invention provides novel capacitors comprising nanofiber enhanced surface area substrates and structures comprising such capacitors, as well as methods and uses for such capacitors.

14 Claims, 3 Drawing Sheets

U.S. PATENT DOCUMENTS

| | | | |
|---|---|---|---|
| 6,090,697 A * | 7/2000 | Xing et al. | 438/618 |
| 6,136,156 A | 10/2000 | El-Shall et al. | |
| 6,159,742 A | 12/2000 | Lieber et al. | |
| 6,190,634 B1 | 2/2001 | Lieber et al. | |
| 6,207,229 B1 | 3/2001 | Bawendi et al. | |
| 6,225,198 B1 | 5/2001 | Alivisatos et al. | |
| 6,306,736 B1 | 10/2001 | Alivisatos et al. | |
| 6,322,901 B1 | 11/2001 | Bawendi et al. | |
| 6,413,489 B1 | 7/2002 | Ying et al. | |
| 6,538,272 B2 * | 3/2003 | Yamazaki et al. | 257/295 |
| 6,616,794 B2 | 9/2003 | Hartman et al. | |
| 6,665,169 B2 * | 12/2003 | Tennent et al. | 361/303 |
| 6,700,771 B2 | 3/2004 | Bhattacharyya | |
| 6,781,817 B2 * | 8/2004 | Andelman | 361/503 |
| 6,872,645 B2 | 3/2005 | Sahi et al. | |
| 6,878,871 B2 | 4/2005 | Scher et al. | |
| 6,903,005 B1 * | 6/2005 | Marsh | 438/627 |
| 7,057,881 B2 * | 6/2006 | Chow et al. | 361/508 |
| 7,068,898 B2 | 6/2006 | Buretea et al. | |
| 7,098,496 B2 * | 8/2006 | Li et al. | 257/295 |
| 7,116,546 B2 * | 10/2006 | Chow et al. | 361/508 |
| 2003/0008123 A1 | 1/2003 | Glatkowski et al. | |
| 2004/0005723 A1 | 1/2004 | Chow et al. | |
| 2004/0026684 A1 | 2/2004 | Empedocles | |
| 2004/0095658 A1 | 5/2004 | Buretea et al. | |
| 2004/0112964 A1 | 6/2004 | Duan et al. | |
| 2004/0124410 A1 | 7/2004 | Lee et al. | |
| 2004/0127634 A1 | 7/2004 | Hsu et al. | |
| 2004/0135951 A1 | 7/2004 | Stumbo et al. | |
| 2004/0136866 A1 | 7/2004 | Pontis et al. | |
| 2004/0146560 A1 | 7/2004 | Whiteford et al. | |
| 2004/0178390 A1 | 9/2004 | Whiteford et al. | |
| 2004/0206448 A1 | 10/2004 | Dubrow | |
| 2005/0038498 A1 | 2/2005 | Dubrow et al. | |
| 2005/0064185 A1 | 3/2005 | Buretea et al. | |
| 2005/0066883 A1 | 3/2005 | Dubrow et al. | |
| 2005/0079659 A1 | 4/2005 | Bock et al. | |
| 2005/0109989 A1 | 5/2005 | Whiteford et al. | |
| 2005/0110064 A1 | 5/2005 | Duan et al. | |
| 2005/0126628 A1 | 6/2005 | Scher et al. | |
| 2005/0219788 A1 | 10/2005 | Chow et al. | |

FOREIGN PATENT DOCUMENTS

| | | |
|---|---|---|
| WO | WO 02-17362 | 2/2002 |
| WO | WO 02-080280 | 10/2002 |
| WO | WO 2004034025 | 4/2004 |
| WO | WO 2005005679 | 1/2005 |
| WO | WO 2005022120 | 3/2005 |
| WO | WO 2005023923 | 3/2005 |

OTHER PUBLICATIONS

Cao, YW. et al., "Growth and Properties of Semiconductor Core/Shell Nanocrystals with InAs Cores" J. Am. Chem. Soc. (2000) 122:9692-9702.

Cui, Y. et al., "Doping and electrical transport in silicon wires" J. Phys. Chem. B. (2000) 104:5213-5216.

Cui, Y. et al., "Diameter-controlled synthesis of single-crystal silicon nanowires" Appl. Phys. Lett. (2001) 78(15):2214-2216.

Dabbousi, B.O. et al., "(CdSe)ZnS core-shell quantum dots: Synthesis and characterization of a size series of highly luminescent nanocrystallites" J. Phys. Chem. B. (1997) 101:9463-9475.

Duan, X. et al., "General synthesis of compound semiconductor nanowires" Adv. Mater. (2000) 12:298-302.

Greene, L.E. et al., Angew. Chem. Int. Ed. (2003) 42-3031-3034.

Gudicksen, M.S. et al., "Diameter-selective synthesis of semiconductor nanowires" J. Am. Chem. Soc. (2000) 122:8801-8802.

Gudicksen, M.S. et al., "Synthetic control of the diameter and length of single crystal semiconductor nanowires" J. Phys. Chem. B. (2001) 105:4062-4064.

Gudicksen, M.S. et al., "Growth of nanowire superlattice structures of nanoscale photonics and electronics" Nature (2002) 415:617-620.

Haraguchi, K. et al., "Polarization Dependence of Ligh Emitted from GaAs p-n junctions in quantum wire crystals" J. Appl. Phys. (1994) 75(8):4220-4225.

Haraguchi, K. et al., "Self-organized fabrication of planar GaAs nanowhisker arrays" Appl. Phys. Lett (1996) 69(3):386-387.

Hiruma, K. et al., "GaAs free-standing quantum-size wires" J. Appl. Phys. (1993) 74(5):3162-3171.

Jun, Y-W, et al., "Controlled synthesis of multi-armed CdS nanorod architectures using monosurfactant system" J. Am. Chem. Soc. (2001) 123:5150-5151.

Kong, J. et al., "Synthesis of individual single-walled carbon nanotubes on patterned silicon wafers" Nature (1998) 395:878-881.

Kong, J. et al., "Chemical vapor deposition of methane for single-walled carbon nanotubes" Chem. Phys. Lett (1998) 292:567-574.

Liu, C. et al., "Sol-Gel Synthesis of Free-Standing Ferroelectric Lead Zirconate Titanate Nanoparticles" J. Am. Chem. Soc. (2001) 123:4344-4345.

Manna, L. et al., "Synthesis of soluble and processable rod-, arrow-, teardrop-, and tetrapod-shaped CdSe nanocrystals" J. Am. Chem. Soc. (2000) 122:12700-12706.

Manna, L. et al., "Epitaxial growth and photochemical annealing of graded Cds/ZnS shells on colloidal CdSe nanorods" J. Am. Chem. Soc. (2002) 124:7136-7145.

Morales, A.M. et al., "A laser ablation method for the synthesis of crystalling semiconductor nanowires" Science (1998) 279:208-211.

Palibroda, E. et al. "Aluminum porous oxide growth. On the electric conductivity of the barrier layer," Thin Solid Films (1995) 256:101.

Peng, X. et al. "Epitaxial growth of highly luminescent CdSe/CdS core/shell nanocrystals with photostability and electronic accessibility" J. Am. Chem. Soc. (1997) 119:7019-7029.

Peng, X. et al., "Shape control of CdSe nanocrystals" Nature (2000) 404:59-61.

Puntes, V.F. et al., "Colloidal nanocrystal shape and size control: The case of cobalt" (2001) Science 291:2115-2117.

Schon, J.H. et al., "Self-assembled monolayer organic field-effect transistors" Nature (2001) 413:713-716.

Thess, A. et al., "Crystalline ropes of metallic carbon nanotubes" Science (1993) 273:483-486.

Urban, J.J. et al., "Synthesis of single-crystalline perovskite nanowires composed of brium titanate and strontium titanate" J. Am. Chem. Soc. (2002) 124:1186-1187.

Wu, Y. et al., "Block-by-block growth of single-crystalline Si/SiGe superlattice nanowires" Nano Letts (2002) 2:83-86.

Yazawa, M. et al., "Semiconductor nanowhiskers" Adv. Mater. (1993) 5:577-580.

Yun, W.S. et al., "Ferroelectric properties of individual barium titanate nanowires investigated by scanned probe microscopy" Nano Lett. (2002) 2(5):447-450.

Zhou, C. et al., "Nanoscale metal/self-assembled monolayer/metal heterostructures" Appl. Phys. Lett. (1997) 71:611-613.

11/203,432 Office Action dated May 15, 2007.

* cited by examiner

NANOFIBER SURFACE BASED CAPACITORS

CROSS-REFERENCE TO RELATED APPLICATIONS

This application is a continuation of U.S. patent application Ser. No. 11/330,557, filed Jan. 12, 2006, now U.S. Pat. No. 7,116,546 which is a continuation of U.S. patent application Ser. No. 11/075,361, filed Mar. 8, 2005, now U.S. Pat. No. 7,057,881, which claims benefit of, and priority to, U.S. Provisional Application No. 60/554,549 filed Mar. 18, 2004, each of which is hereby incorporated by reference in its entirety.

FIELD OF THE INVENTION

The invention relates primarily to the field of nanotechnology. More specifically, the invention pertains to capacitors comprising nanofibers and nanofiber enhanced surface areas, as well as to the use of such capacitors in various applications and devices.

BACKGROUND OF THE INVENTION

Various configurations of nanostructures (e.g., nanofibers, nanowires, nanocrystals, etc.) have attracted widespread interest for their novel properties in electrical, chemical, optical and other similar applications. Nanostructures have a broad possibility of uses, such as semiconductors for nanoscale electronics, optoelectronic applications (e.g., in lasers, LEDs, etc.) photovoltaics, sensors, etc.

Correspondingly, capacitors are pervasive electronic elements. Often, it is quite desirous to place capacitors of particular capacitance, durability, and/or construction within extremely small spaces.

In almost all instances, however, the efficiency or use of such devices is limited, at least in part, by the area of the surface which is in contact with, or comprises, the electrode plates of the capacitor. This limitation is true in several aspects. First, space limitations (or "footprint" limitations) are of concern. For example, for defined materials, a certain capacitance can exist per unit area of a surface (i.e., within a certain footprint area). Thus, the capacitance is limited by, inter alia, the footprint of the surfaces which comprise the capacitor. One answer to such problem is to increase the size of the footprint involved. However, besides being inelegant, such response is often problematic due to cost restraints and size limitations imposed on the footprint itself (e.g., the capacitor might need to be placed in a limited space in a device, etc.)

In a number of conventional or current applications, the surface area of a capacitor's electrode surface is increased by providing the material making up the surface with a number of holes or pores (e.g., by etching a metal plate, etc.). By providing such matrix as a porous solid, rather than just a solid surface, one increases the amount of available surface area without increasing the amount of space that the material occupies (i.e., the footprint size). While such porous matrices do increase the surface area of the electrode surface, a number of issues arise to limit the effectiveness of such measures. A final, but not trivial, problem concerns cost. Larger devices/surfaces/structures that are needed, e.g., to allow the proper capacitance, can be quite expensive.

Thus, a welcome addition to the art would be capacitors (and devices, etc. comprising capacitors) which have enhanced surface areas which would have the benefits of, e.g., increased capacitance per unit area footprint. The current invention provides these and other benefits which will be apparent upon examination of the following.

SUMMARY OF THE INVENTION

In some aspects the current invention comprises an electric capacitor which has at least one electrode surface that comprises a plurality of nanofibers. In typical embodiments, the electrode surface is comprised of a conductive material (e.g., a metal, a semiconducting material, a polymer, a resin, etc.). In some, but not all, preferred embodiments, the electrode surface and/or the nanofibers of the electrode surface are comprised of silicon. While in some embodiments the electrode surface and its nanofibers are of the same material (e.g., silicon, etc.), in other embodiments the surface and the nanofibers are of different materials from one another. Additionally, while the nanofibers are optionally grown in place upon the electrode surface, they are also optionally grown upon a different surface and subsequently placed/attached to the electrode surface.

In other embodiments of the invention, the capacitor also comprises a dielectric of a nonconductive material which covers substantially all members of the plurality of nanofibers (and the electrode surface on which the nanofibers exist). The dielectric, thus, exists between the electrode surfaces (or "electrode plates" or the like) of the capacitor. Such dielectric can optionally be composed of one or more of a number of materials, e.g., oxides, nitrides, various nonconductive polymers, ceramics, resins, porcelains, mica containing materials, glass, vacuum, rare earth oxides, gas (e.g., air, inert gases, etc.), or other typical dielectrics used in electronic capacitors. Those of skill in the art are quite familiar with a broad range of materials used as dielectrics and capable of use as dielectrics in the current invention. In some embodiments, the dielectric comprises a grown oxide layer and/or a naturally occurring oxide layer. The dielectric can comprise, e.g., a metal oxide such as aluminum oxide or tantalum oxide, etc. The dielectric can also comprise silicon oxide.

In various embodiments, the dielectric, e.g., oxide layer, comprises a desired thickness (depending upon, e.g., the desired capacitance and other parameters such material construction, etc.). For example, the dielectric, e.g., oxide layer, can comprise a thickness from about 1 nm or less to about 1 um, from about 2 nm or less to about 750 nm, from about 5 nm or less to about 500 nm, from about 10 nm or less to about 250 nm, or from about 50 nm or less to about 100 um. The dielectric, e.g., oxide layer, can also comprise a thickness that is substantially equivalent to the thickness of the electrode surface(s).

In typical embodiments, the capacitors herein also comprise a second electrode surface. Such second surface can comprise, e.g., a layer of material deposed upon the dielectric which covers the plurality of nanofibers and the first electrode surface. In such embodiments, the second surface material can comprise a conductive material (e.g., similar to the optional composition of the first electrode surface such as a metal, a semiconducting material, a polymer, a resin, etc.). In various embodiments, the two electrode surfaces can be of the same composition, or can be of different composition. In some embodiments, the second surface comprises an evaporated or sputtered electrically conducting material. Such evaporated/sputtered materials can include, e.g., aluminum, tantalum, platinum, nickel, a semiconducting material, polysilicon, titanium, titanium oxide, an electrolyte, gold, etc.

The various embodiments of capacitors herein can have a number of different densities of nanofibers per unit area outline (i.e., per footprint area). For example, the density of the members of the plurality of nanofibers can range from about 0.11 nanofiber per square micron or less to at least about 1000 nanofibers per square micron, from about 1 nanofiber per square micron or less to at least about 500 nanofibers per square micron, from about 10 nanofibers per square micron or less to at least about 250 nanofibers per square micron, or from about 50 nanofibers per square micron or less to at least about 100 nanofibers per square micron.

Also, in various embodiments (e.g., in those wherein the nanostructures comprise nanofibers, nanowires, or the like as opposed to nanocrystal or other similar nanostructures whose structural profile is not substantially cylindrical or tubular), the length of the members of the plurality of nanofibers can optionally range from about 1 micron or less to at least about 500 microns, from about 5 micron or less to at least about 150 microns, from about 10 micron or less to at least about 125 microns, or from about 50 micron or less to at least about 100 microns; and wherein the diameter of the members of the plurality of nanofibers ranges from about 5 nm or less to at least about 1 micron, from about 10 nm or less to at least about 500 nm, from about 20 nm or less to at least about 250 nm, from about 20 nm or less to at least about 200 nm, from about 40 nm or less to at least about 200 nm, from about 50 nm or less to at least about 150 nm, or from about 75 nm or less to at least about 100 nm.

In yet other embodiments, the capacitors of the invention can comprise an electrode surface that, because of the nanofibers present, is considerably greater in surface area than other typical electrode surfaces of similar or substantially equal footprint. For example, the density of the members of the plurality of nanofibers can optionally increase the surface area of the electrode surface from at least 1.5 times to at least 100,00 times or more, at least 5 times to at least 75,000 times or more, at least 10 times to at least 50,000 times or more, at least 50 times to at least 25,000 times or more, at least 100 times to at least 10,000 times or more, or at least 500 times to at least 1,000 times or more, greater, in comparison to an area of substantially equal footprint of an electrode surface without nanofibers Additionally, in other embodiments, the capacitors of the invention can comprise a farad capacity that, because of the nanofibers present, is considerably greater in amount than that of other typical electrode surfaces of similar or substantially equal footprint. For example, the farad capacity of the capacitors of the invention can comprise from about at least 1.5 times to at least 100,00 times or more, at least 5 times to at least 75,000 times or more, at least 10 times to at least 50,000 times or more, at least 50 times to at least 25,000 times or more, at least 100 times to at least 10,000 times or more, or at least 500 times to at least 1,000 times or more greater capacitance than a capacitor having an electrode surface of substantially equal footprint but not comprising a plurality of nanofibers.

In yet other aspects, the invention comprises a device which comprises any of the capacitors of the invention. For example, timepieces, remote controls, medical devices, radios, computers, electronic equipment, etc. which have a capacitor herein are also aspects of the invention.

These and other objects and features of the invention will become more fully apparent when the following detailed description is read in conjunction with the accompanying figures.

DETAILED DESCRIPTION

The current invention comprises a number of different embodiments focused on nanofiber enhanced area surface substrates and uses thereof in capacitors. As will be apparent upon examination of the present specification, figures, and claims, substrates having such enhanced surface areas present improved and unique capacitance aspects that are beneficial in a wide variety of applications ranging from materials science to medical use and beyond. It will be appreciated that enhanced surface areas herein are sometimes labeled as "nanofiber enhanced surface areas" or, alternatively depending upon context, as "nanowire enhanced surface areas," etc.

A common factor in the embodiments is the special morphology of nanofiber surfaces (typically silicon oxide nanowires herein, but also encompassing other compositions and forms). For example, the vastly increased surface area presented by such substrates is utilized in, e.g., creation of improved capacitors for a wide variety of uses. In most aspects herein, it is thought that such benefits accrue from the unique morphology of the nanofiber surfaces (especially form the vastly increased surface area), but the various embodiments herein are not necessarily limited by such theory in their construction, use, or application. In some embodiments, the nanofibers are optionally functionalized with one or more entity.

Again, without being bound to a particular theory or mechanism of operation, the concept of the majority of benefits of the invention is believed to operate, at least in part, on the principle that the nanofiber surfaces herein present a greatly enhanced surface area in relation to the same footprint area without nanofibers.

Capacitors

Figure 1:
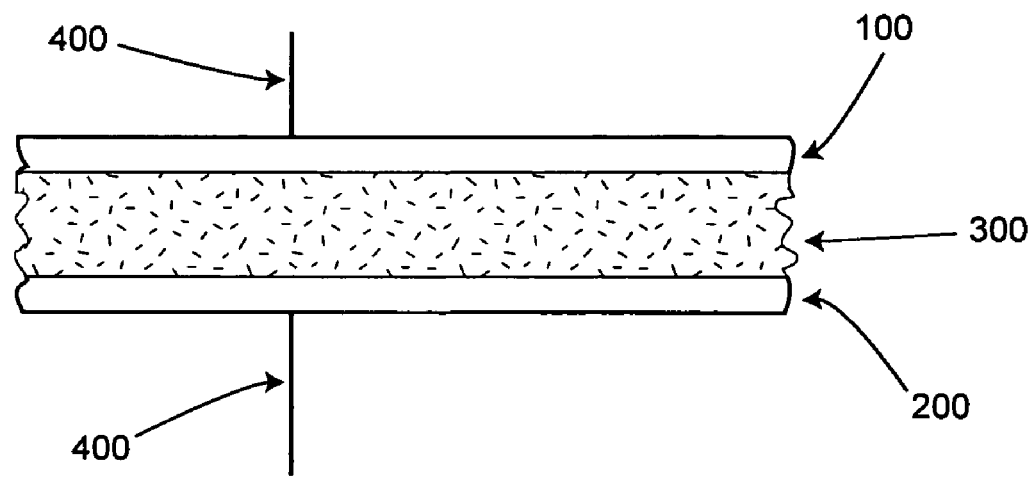
FIG. 1, Displays a schematic diagram of a generalized capacitor.

Capacitors, in general and in specific applications, are quite well known in the art. Various types of capacitors, e.g., electrolytic capacitors, are replete throughout the literature. FIG. 1 shows the basic components of a capacitor in a generalized fashion. In typical capacitors, a dielectric material is layered between two conductive electrodes (typically metal). An electrical charge proportional to the voltage can then be stored in the capacitor when a voltage is applied across the electrodes. Thus, in FIG. 1, electrodes 100 and 200 (alternately termed "electrode plates," "electrode surfaces," or "opposing plates" or the like) are separated by dielectric, 300. The electrodes are typically electrically connected to other components via connections such as 400. The capacitance "C" of a parallel-plate capacitor is given by Equation 1.

Equation 1:
$$C = \frac{\varepsilon_0 K_d A}{d}.$$

In Equation 1, "A" represents the area of the two plates in the capacitor, while "$E_0$" represents the dielectric permittivity of vacuum or free space (8.85×10-12F/m). "$K_d$" represents the dielectric constant of the dielectric and "d" is the distance between the two plates of the capacitor. As can be seen, capacitance depends upon the thickness of the dielectric (e.g., the distance between the electrodes), the dielectric constant of the dielectric, and the area (or effective area) of contact between the plates of the capacitor. Thus, greater capacitance can be achieved through, e.g., increasing the dielectric constant of the dielectric (e.g., by choosing a particular dielectric material), increasing the electrode surface areas (e.g., by making the electrode plates larger, etc.), decreasing the distance between the electrodes, or combinations thereof. As described below, a number of traditional capacitors (e.g., electrolytic capacitors) optimize capacitance by etching/roughening the surface of the electrode to increase the surface area "A."

It will be appreciated that choice of dielectric material is an effective means of manipulating the qualities of capacitors. For example, metal oxides can be used as materials for dielectrics. In other words, specific oxides are based upon the composition of the electrode plates in the capacitor, e.g., aluminum oxides as dielectrics upon aluminum electrode plates, etc. In many capacitors, aluminum oxide and tantalum oxide (typically tantalum pentoxide) are often chosen. Thus, in many types of capacitors (typically electrolytic capacitors) different metals (e.g., tantalum, aluminum, zinc, niobium and zirconium) are coated with an oxide through an electrochemical process. For example, a thin layer or coating of $Al_2O_3$ (aluminum oxide) can be formed on an aluminum electrode plate by placing the metal in the proper chemical solution and running an electric current through it. The thickness of such oxide layers (e.g., less than a micrometer, etc.) can be manipulated through changes in reaction conditions. The oxide layer thus formed, comprises the dielectric of the capacitor. Typical dielectrics made of metal oxides can be quite effective in capacitors, and can withstand extremely high fields without breakdown. Various arrangements of such capacitors can be rectifying (typical) or non-rectifying (often constructed with two opposing layers of oxidized material).

As an often related point, the thickness of the dielectric, which also influences the capacitance, see Equation 1, can depend upon the choice of material for the dielectric. For example, oxide layers (e.g., metal oxide layers as described above) are quite thin. Those of skill in the art will be familiar with such thin oxide layers, e.g., from usage in electrolytic capacitors, etc. Such thinness also increases the capacitance in addition to the dielectric constant component/influence of the dielectric material itself because the thinness/thickness of the dielectric is often the distance, or is effectively the distance, between the electrode plates.

Yet another method of modifying capacitance is through change of the effective areas of the electrode plates. Those of skill in the art will be quite familiar with various means used to increase such effective areas. For example, some capacitors have increased the surface area of one or both of the electrode plates through, e.g., constructing the electrode plates from activated carbon fibers, etching or sintering of the surfaces of the electrode plates (e.g., etching metal), etc.

For example, etching (e.g., chemical etching with acids) can produce an increased surface area 30-100 times greater than an unetched surface. A dielectric (e.g., a metal oxide) is then typically formed/placed over the increased surface area. Those of skill in the art will be knowledgeable about such practices and their corresponding use in construction of capacitors.

Once the surface area electrode has been covered with a dielectric, the opposing electrode can touch, or effectively touch, the dielectric. For example, a wet electrolytic solution can exist between the dielectric (touching and filling the surface variations) and the opposing electrode. Dry electrolytic material can also fulfill a similar role. In either case, the solutions between the dielectric and the opposing electrode, in effect, become extensions/part of the opposing electrode.

Nanofiber-Enhanced Capacitors

The capacitors of the present invention provide large capacitance values per footprint area of electrode plate, thus, allowing construction of quite small and/or quite powerful capacitors. The capacitors herein have one or more electrode plate which comprises nanofiber surfaces. As explained below, such nanofiber surfaces can optionally encompass myriad nanostructures (e.g., nanowires, nanorods, nanocrystals, etc.) which vastly increase the surface area of the electrode plates. As explained above, increasing the surface area of the electrodes in a capacitor increases its capacitance.

Figure 2:
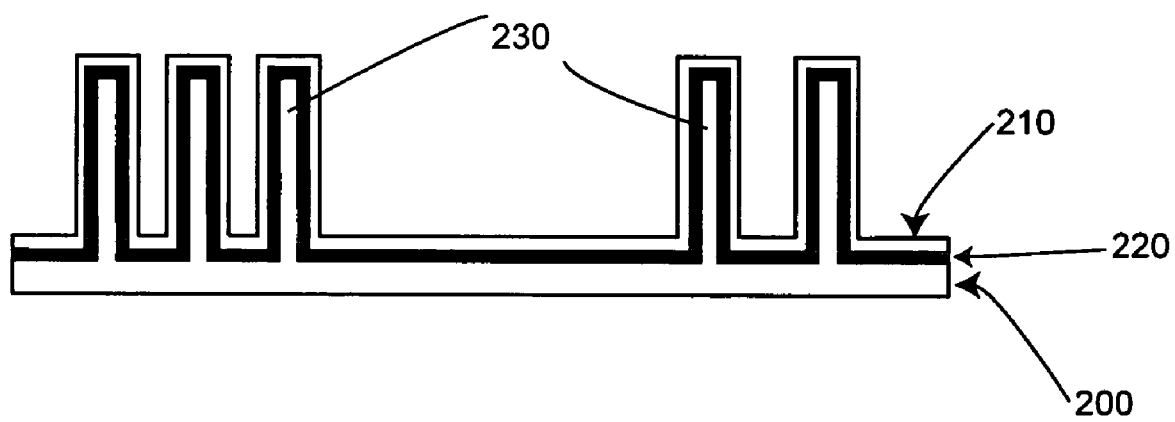
FIG. 2, Displays a schematic diagram representing an enhanced surface area capacitor.

FIG. 2 displays a schematic diagram illustrating one possible embodiment of the current invention. As seen in FIG. 2, an electrode plate, 200, comprises a number of nanofibers, 230, upon it. In preferred embodiments, such nanofibers and electrode plate are "coated" with a dielectric, 220, (e.g., typically an oxide layer), which dielectric is then "coated" with another material to form the second, or opposing, electrode plate, 210.

In typical embodiments, the surface of the electrode plate (e.g., the area between nanofiber attachments) is comprised of a conductive material (e.g., typically a metal, a semiconducting material, an electrically conductive polymer or resin, etc.). Additionally, the nanofibers themselves are preferably comprised of electrically conductive material(s) such as, e.g., metals, semiconducting materials, electrically conductive polymers, resins, etc. The electrode plate surface and/or the nanofibers on the plate are optionally comprised of silicon or silicon compounds. No matter the exact composition of the nanofibers and the rest of the body of the electrode plate, such features (i.e., the nanofibers and the plate surface) can optionally be comprised of the same material or can optionally be comprised of different materials. For example, the nanofibers can optionally comprise silicon/silicon compounds while the electrode plate can optionally comprise an electrically conductive metal. The possible difference in composition between the nanofibers and the plate surface can arise, e.g., because the plurality of nanofibers can optionally be grown upon a different surface, harvested, and then deposited/attached to the electrode plate surface.

Also, as can be seen in FIG. 2, capacitors of the invention comprise a dielectric that typically "coats" the nanofiber surface of the electrode plate. Thus, the dielectric closely conforms to the shape of the nanofibers and the electrode plate, in effect, forming a coating over them. The dielectric typically coats or covers substantially all nanofibers and/or all areas of the electrode plate which comprises the nanofibers.

In many embodiments, the dielectric comprises an oxide layer, typically an oxide of the material(s) which form the nanofibers/electrode plate. For example, in some embodiments herein the dielectric comprises a silicon oxide layer coating the nanofibers/electrode plate. In yet other embodiments, the dielectric is one or more of: an oxide, a nitride, a polymer, a ceramic, a resin, a porcelain, a mica containing material, a glass, vacuum, a rare earth oxide, a gas, etc. Those of skill in the art will be familiar with other typical dielectrics used in electronic capacitors and which are capable of use in the present invention. In any case, as with typical capacitors, the dielectric in the present invention consists of a nonconductive material.

In embodiments wherein the dielectric comprises an oxide layer, such layer can be, e.g., a grown oxide layer or a naturally occurring oxide layer. Again, typical oxide layers herein comprise silicon oxides. Those of skill in the art will also be aware of methods of manipulating thickness and other growth/construction aspects of such oxide layers in order to achieve the desired dielectric parameters. For example, particular environmental conditions present during the growth/construction of oxide layers can influence the thickness of the oxide layer, etc.

In various embodiments, the dielectric (e.g., the oxide layer) comprises a thickness of from about 1 nm or less to about 1 um, from about 2 nm or less to about 750 nm, from about 5 nm or less to about 500 nm, from about 10 nm or less to about 250 nm, or from about 50 nm or less to about 100 um. In yet other embodiments, the thickness is substantially equivalent to the thickness of the electrode surface comprising the nanofibers.

In typical embodiments herein, the capacitor comprises a second electrode plate, i.e., an opposing electrode plate that is on the opposite side of the dielectric than the electrode plate comprising the nanofiber surface. In preferred embodiments, this second electrode plate comprises a layer of material deposed upon the dielectric (i.e., covering the plurality of nanofibers on the first electrode plate). See, e.g., FIG. 2. As with typical capacitors, the second electrode plate is also electrically conductive, e.g., is composed of electrically conductive material(s) such as metals, semiconducting materials, conductive polymers, conductive resins, etc. In order to achieve the close mating between the second electrode plate and the complex nanofiber surface (i.e., coated with the dielectric), the second electrode plate is preferably evaporated or sputtered onto the dielectric. For example, an electrically conductive metal (e.g., aluminum, tantalum, platinum, titanium, nickel, gold, etc.), a semiconducting material, polysilicon, titanium oxide, or an electrolyte, etc. can be used as the material of the second electrode plate. In some embodiments, the second electrode plate can optionally comprise an electrolytic solution (either liquid or non-liquid) which, in effect, acts as the second electrode plate. Those of skill in the art will be familiar with similar electrolytic set-ups from traditional electrolytic capacitors, etc.

In the various embodiments herein, the capacitors (i.e., the electrode plates comprising the nanofiber surfaces) can have various densities of nanofibers within footprint areas. For example, some embodiments comprise nanofiber densities of from about 0.11 nanofiber per square micron or less to at least about 1000 nanofibers per square micron, from about 1 nanofiber per square micron or less to at least about 500 nanofibers per square micron, from about 10 nanofibers per square micron or less to at least about 250 nanofibers per square micron, or from about 50 nanofibers per square micron or less to at least about 100 nanofibers per square micron.

Also, in different embodiments herein, the length of the nanofibers within the capacitors can be of different lengths. For example, the length of the nanofibers herein can range from about 1 micron or less to at least about 500 microns, from about 5 micron or less to at least about 150 microns, from about 10 micron or less to at least about 125 microns, or from about 50 micron or less to at least about 100 microns. Also, such various embodiments can comprise nanofibers of various diameters as well. Thus, different embodiments can comprise nanofibers that range in diameter from about 5 nm or less to at least about 1 micron, from about 10 nm or less to at least about 500 nm, from about 20 nm or less to at least about 250 nm, from about 20 nm or less to at least about 200 nm, from about 40 nm or less to at least about 200 nm, from about 50 nm or less to at least about 150 nm, or from about 75 nm or less to at least about 100 nm.

In the capacitors herein, the addition of the nanofibers to the electrode surface can increase the surface area of the electrode surface (in comparison to an electrode surface which does not have nanofibers) by at least 1.5 times to at least 100,00 times or more, by at least 5 times to at least 75,000 times or more, by at least 10 times to at least 50,000 times or more, by at least 50 times to at least 25,000 times or more, by at least 100 times to at least 10,000 times or more, or by at least 500 times to at least 1,000 times or more. Such comparisons are typically made by comparing similar "footprints" of electrode plates, i.e., similar or substantially similar area outlines.

Figure 4:
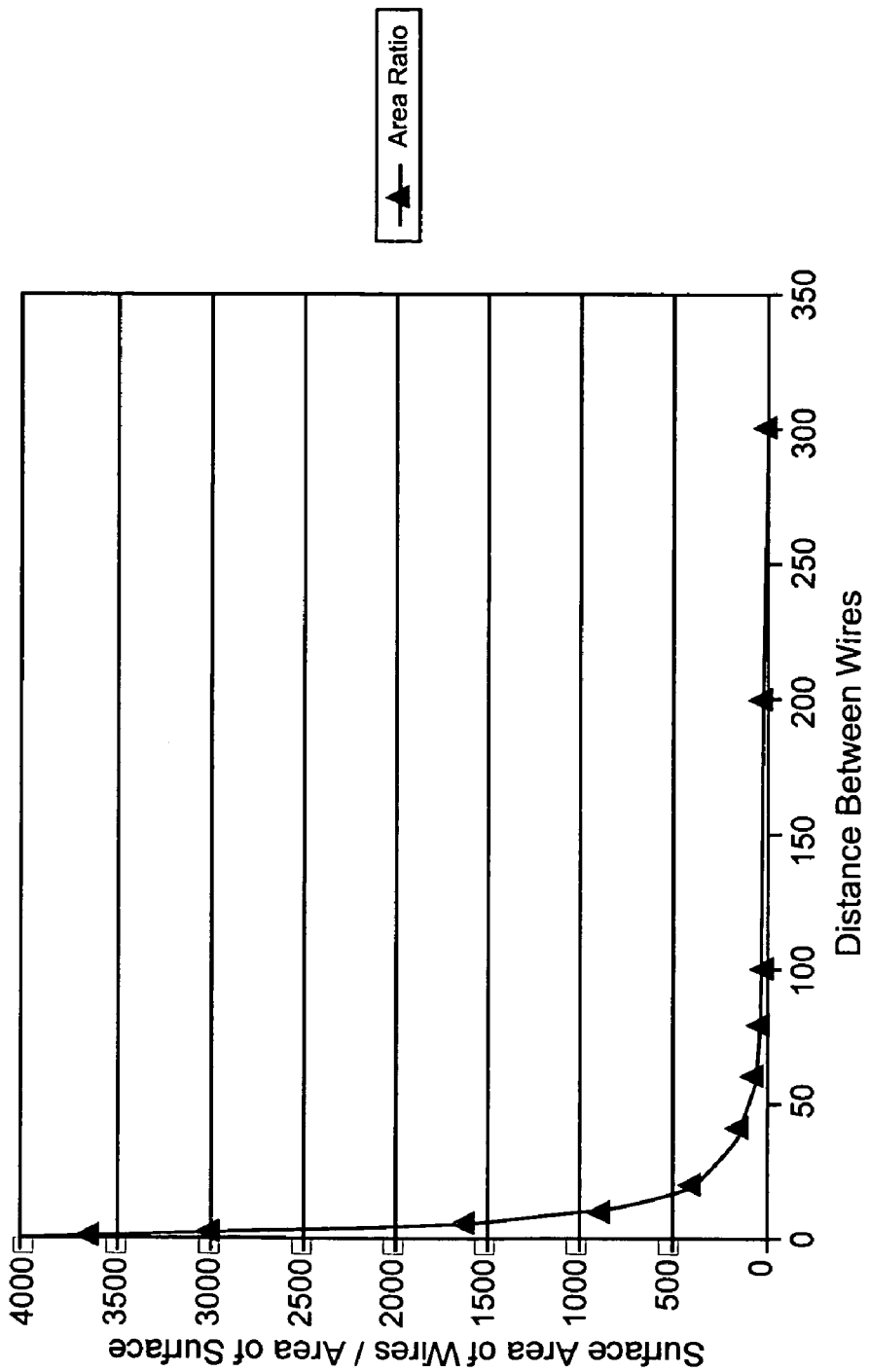
FIG. 4, Displays a graph comparing the surface area of a nanofiber enhanced area against varying distances between nanofibers.

An example of the increase in effective area of an electrode plate of the invention can be seen in FIG. 4. The graph in FIG. 4 compares the surface area of a nanofiber enhanced area against the distance between the nanofibers on the area. Thus, 10 nm nanowires with a 2 nm aluminum/aluminum oxide coating that are stacked 10 nm apart would produce a surface area that would be ten times greater than any surface reported in the literature.

Also, within the capacitors herein, addition of nanofibers to the electrode surface/plate can increase the farad capacity of the capacitor by about at least 1.5 times to at least 100,00 times or more, by at least 5 times to at least 75,000 times or more, by at least 10 times to at least 50,000 times or more, by at least 50 times to at least 25,000 times or more, by at least 100 times to at least 10,000 times or more, or by at least 500 times to at least 1,000 times or more in relation to a capacitor which does not comprise a nanofiber enhanced surface. Again, such comparisons are typically made against similar or substantially similar footprint or outline areas.

The current invention also includes devices comprising capacitors with nanofiber enhanced surfaces (i.e., typically nanofiber enhanced electrode plates). Myriad examples of such devices can be contemplated. Those of skill in the art will appreciate the wide range of devices capable of comprising/utilizing these capacitors. Basically, any device requiring a capacitor (especially a capacitor of large farad capability and small size) can comprise/utilize the current invention. Nonlimiting examples of such devices can include, e.g., timepieces, watches, radios, remote controls, nanodevices, medical implant devices (e.g., pacemakers, prosthetic devices with electrical components, etc.), flow through capacitors, e.g., for water purification or solute sorting/separation.

Characteristics of Nanofiber Surface Substrates

As noted previously, increased surface area is a property that is sought after in many fields (e.g., in substrates for assays or separation column matrices) as well as the current capacitors. For example, fields such as tribology and those involving separations and adsorbents are quite concerned with maximizing surface areas. Other inventions by the inventor and coworkers have focused on such applications. See, e.g., NANOFIBER SURFACES FOR USE IN ENHANCED SURFACE AREA APPLICATIONS, U.S. Ser. No. 10/792,402, filed Mar. 2, 2004. The current invention offers capacitors, and applications of such, having surfaces that are increased or enhanced with nanofibers (i.e., increased or enhanced in area in relation to structures or surfaces without nanofibers, such as "planar" surfaces).

A "nanofiber enhanced surface area" or a capacitor or capacitor electrode surface with an "enhanced surface area," etc. herein corresponds to a capacitor or capacitor electrode surface comprising a plurality of nanofibers (e.g., nanowires, nanotubes, nanospheres, etc.) attached to a substrate so that the surface area within a certain "footprint" of the substrate is increased relative to the surface area within the same footprint without the nanofibers. Such footprint corresponds to outlining the parameters of the measurement area.

As explained in greater detail below, in typical embodiments herein, the nanofibers (and often the electrode surface substrate) are composed of silicon and/or silicon oxides. It will be noted that such compositions convey a number of benefits in certain embodiments herein. Also, in some embodiments herein, one or more of the plurality of nanofibers is functionalized with one or more moiety. See, below. However, it should also be noted that the current invention is not specifically limited by the composition of the nanofibers or of the substrate or of any functionalization, unless otherwise noted.

Figure 3B:
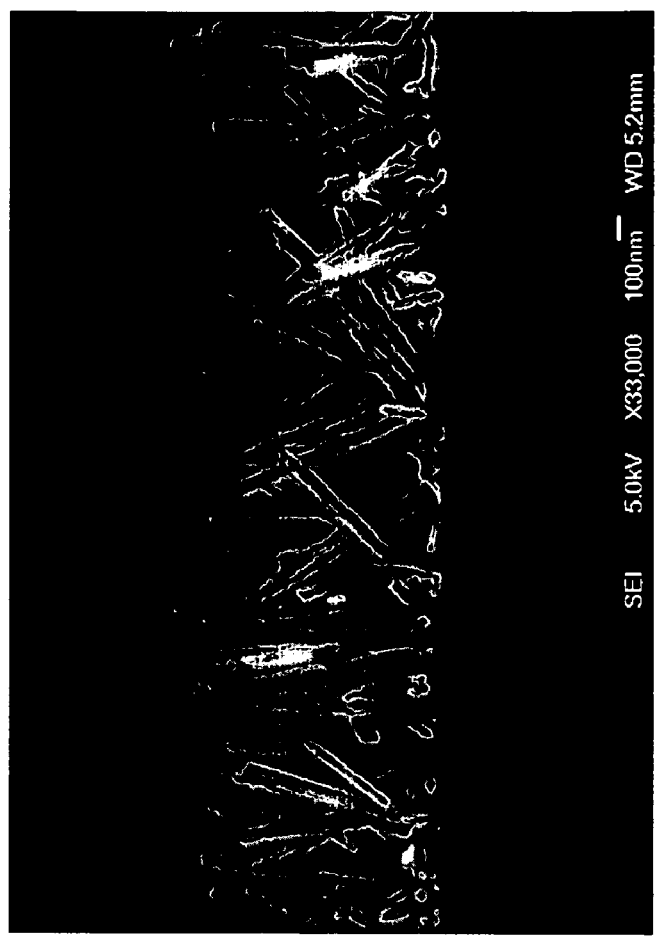
FIG. 3, Panels A and B, Display photomicrographs of enhanced surface area substrates such as can form the basis for enhanced surface area capacitors.
Figure 3A:
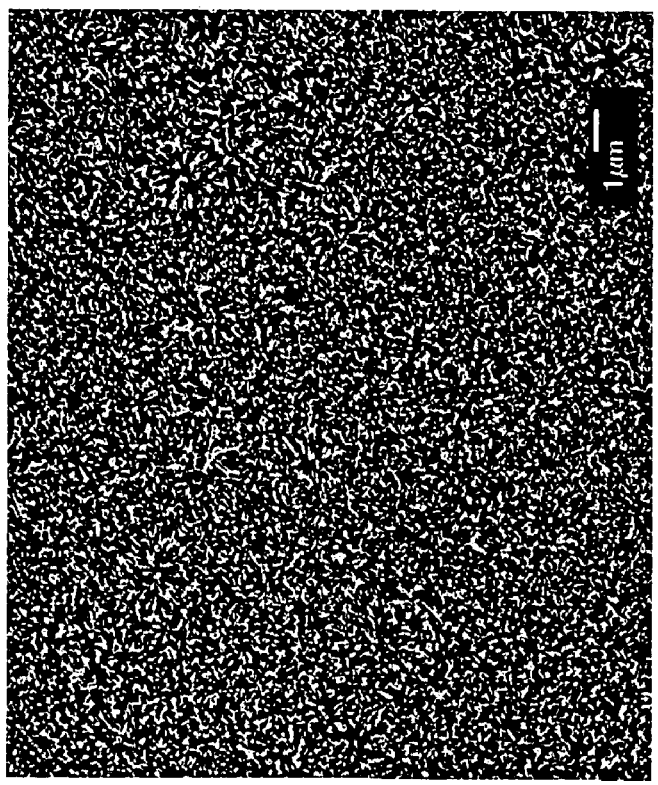

Thus, as an illustrative, but not limiting, example, FIGS. 2 and 3 present schematic and actual representations of nanofiber enhanced surface area substrates of the invention, such as would be constructed within capacitors herein. FIG. 2 shows a schematic of a nanofiber capacitor. FIG. 3 displays photomicrographs of an enhanced surface area nanofiber substrate such as would form the basis for a nanofiber plate element. It will be noted that the number and shape and distribution of the nanofibers allows ample opportunity for increased surface area, etc. Again, it is to be emphasized that such examples are merely to illustrate the myriad possible embodiments of the current invention.

The various embodiments of the current invention are adaptable to, and useful for, a great number of different applications. For example, as explained in more detail below, various permutations of the invention can be used in, e.g., any number of devices requiring capacitors. Other uses and embodiments are examined herein.

As will be appreciated by those of skill in the art, in numerous materials the surface properties can optionally provide a great deal of the functionality or use of the material. For example, in various embodiments, the adherence or coverage of the dielectric is provided by or aided by interaction of the nanofiber elements with appropriate functionalization moieties.

As also will be appreciated by those of skill in the art, many aspects of the current invention are optionally variable (e.g., surface chemistries on the nanofibers, surface chemistries on any end of the nanofibers or on the substrate surface, etc.). Specific illustration of various modifications, etc. herein, should therefore not be taken as necessarily limiting the current invention. Also, it will be appreciated, and is explained in more detail below, that the length to thickness ratio of the nanofibers herein is optionally varied, as is, e.g., the composition of the nanofibers and the dielectric. Furthermore, a variety of methods can be employed to bring the fibers in contact with surfaces. Additionally, while some embodiments herein comprise nanofibers that are specifically functionalized in one or more ways, e.g., through attachment of moieties or functional groups to the nanofibers, other embodiments comprise nanofibers which are not functionalized.

Nanofibers and Nanofiber Construction

In typical embodiments herein the surfaces (i.e., the nanofiber enhanced area surfaces) and the nanofibers themselves can optionally comprise any number of materials. The actual composition of the surfaces and the nanofibers is based upon a number of possible factors. Such factors can include, for example, the intended use of the enhanced area surfaces, e.g., the specific parameters such as amount of capacitance and/or capacitance per unit area needed, the conditions under which they will be used (e.g., temperature, pH, presence of light (e.g., UV), atmosphere, etc.), the durability of the surfaces and the cost, etc. In typical and preferred embodiments the nanofibers are electrically conductive. The ductility and breaking strength of nanowires will vary depending on, e.g., their composition. For example, ceramic ZnO wires can be more brittle than silicon or glass nanowires, while carbon nanotubes may have a higher tensile strength.

As explained more fully below, some possible materials used to construct the nanofibers and nanofiber enhanced surfaces herein, include, e.g., silicon, ZnO, TiO, carbon, and carbon nanotubes. See below. The nanofibers of the invention are also optionally coated or functionalized, e.g., to enhance or add specific properties. For example, polymers, ceramics or small molecules can optionally be used as coating materials on the nanofibers, e.g., between the nanofibers and the dielectric, etc. The optional coatings can impart characteristics such as water resistance, improved electrical properties, etc. Additionally, specific moieties or functional groups can also be attached to or associated with the nanofibers herein.

Of course, it will be appreciated that the current invention is not limited by recitation of particular nanofiber and/or substrate compositions, and that, unless otherwise stated, any of a number of other materials are optionally used in different embodiments herein. Additionally, the materials used to comprise the nanofibers can optionally be the same as the material used to comprise the substrate surfaces or they can be different from the materials used to construct the substrate surfaces.

In yet other embodiments herein, the nanofibers involved can optionally comprise various physical conformations such as, e.g., nanotubules (e.g., hollow-cored structures), nanorods, nanocrystals, nanowhiskers etc. A variety of nanofiber types are optionally used in this invention including carbon nanotubes, metallic nanotubes, metals and ceramics. Such nanostructures are all optionally used in increasing the surface area of the electrode surfaces, etc. While typical embodiments herein recite "nanofiber," such language should not be construed as necessarily limiting unless specified to be so.

It is to be understood that this invention is not limited to particular configurations, which can, of course, vary (e.g., different combinations of nanofibers and substrates and optional moieties, etc. which are optionally present in a range of lengths, densities, etc.). It is also to be understood that the terminology used herein is for the purpose of describing particular embodiments only, and is not intended to be necessarily limiting. As used in this specification and the appended claims, the singular forms "a," "an" and "the" include plural referents unless the context clearly dictates otherwise. Thus, for example, reference to "a nanofiber" optionally includes a plurality of such nanofibers, and the like. Unless defined otherwise, all scientific and technical terms are understood to have the same meaning as commonly used in the art to which they pertain. For the purpose of the present invention, additional specific terms are defined throughout.

A) Nanofibers

The term "nanofiber" as used herein, refers to a nanostructure typically characterized by at least one physical dimension less than about 1000 nm, less than about 500 nm, less than about 250 nm, less than about 150 nm, less than about 100 nm, less than about 50 nm, less than about 25 nm or even less than about 10 nm or 5 nm. In many cases, the region or characteristic dimension will be along the smallest axis of the structure.

Nanofibers of this invention typically have one principle axis that is longer than the other two principle axes and, thus, have an aspect ratio greater than one, an aspect ratio of 2 or greater, an aspect ratio greater than about 10, an aspect ratio greater than about 20, or an aspect ratio greater than about 100, 200, or 500. In certain embodiments, nanofibers herein have a substantially uniform diameter. In some embodiments, the diameter shows a variance less than about 20%, less than about 10%, less than about 5%, or less than about 1% over the region of greatest variability and over a linear dimension of at least 5 nm, at least 10 nm, at least 20 nm, or at least 50 nm. For example, a wide range of diameters could be desirable due to cost considerations and/or to create a more random surface. Typically the diameter is evaluated away from the ends of the nanofiber (e.g. over the central 20%, 40%, 50%, or 80% of the nanofiber). In yet other embodiments, the nanofibers herein have a non-uniform diameter (i.e., they vary in diameter along their length). Also in certain embodiments, the nanofibers of this invention are substantially crystalline and/or substantially monocrystalline.

Once again, it will be appreciated that the term nanofiber, can optionally include such structures as, e.g., nanowires, nanowhiskers, semi-conducting nanofibers, carbon nanotubes or nanotubules and the like.

The nanofibers of this invention can be substantially homogeneous in material properties, or in certain embodiments they are heterogeneous (e.g. nanofiber heterostructures) and can be fabricated from essentially any convenient material or materials. The nanofibers can comprise "pure" materials, substantially pure materials, doped materials and the like and can include, in various combinations, insulators, conductors, and semiconductors. Additionally, while some illustrative nanofibers herein are comprised of silicon (or silicon oxides), as explained above, they optionally can be comprised of any of a number of different materials, unless otherwise stated.

Composition of nanofibers can vary depending upon a number of factors, e.g., specific functionalization (if any) to be associated with or attached to the nanofibers, durability, cost, conditions of use, etc. The composition of nanofibers is quite well known to those of skill in the art. As will be appreciated by such skilled persons, the nanofibers of the invention can, thus, be composed of any of a myriad of possible substances (or combinations thereof). Some embodiments herein comprise nanofibers composed of one or more organic or inorganic compound or material. Any recitation of specific nanofiber compositions herein should not be taken as necessarily limiting.

Additionally, the nanofibers of the invention are optionally constructed through any of a number of different methods, and examples listed herein should not be taken as necessarily limiting. Thus, nanofibers constructed through means not specifically described herein, but which fall within the parameters as set forth herein are still nanofibers of the invention and/or are used with the devices and methods of the invention.

In a general sense, the nanofibers of the current invention often (but not exclusively) comprise long thin protuberances (e.g., fibers, nanowires, nanotubules, etc.) grown from a solid, optionally planar, substrate. Of course, in some embodiments herein, the fibers are detached from the substrate on which they are grown and attached to a second substrate. The second substrate need not be planar and, in fact, can comprise a myriad of three-dimensional conformations, as can the substrate on which the nanofibers were grown originally. In some embodiments herein, the substrates are flexible. Also, as explained in greater detail below, nanofibers of the invention can be grown/constructed in, or upon, variously configured surfaces, e.g., on a flat substrate that is rolled into an overlapping cylinder, etc. See infra.

In various embodiments herein, the nanofibers involved are optionally grown on a first substrate and then subsequently transferred to a second substrate which is to have the enhanced surface area. Such embodiments are particularly useful in situations wherein the substrate desired needs to be flexible or conforming to a particular three dimensional shape that is not readily subjected to direct application or growth of nanofibers thereon. For example, nanofibers can be grown on such rigid surfaces as, e.g., silicon wafers or other similar substrates. The nanofibers thus grown can then optionally be transferred to a flexible backing. Again, it will be appreciated, however, that the invention is not limited to particular nanofiber or substrate compositions. For example, nanofibers are optionally gown on any of a variety of different surfaces, including, e.g., flexible foils such as aluminum or the like. Additionally, for high temperature growth processes, any metal, ceramic or other thermally stable material is optionally used as a substrate on which to grow nanofibers of the invention. Furthermore, low temperature synthesis methods such as solution phase methods can be utilized in conjunction with an even wider variety of substrates on which to grow nanofibers. For example, flexible polymer substrates and other similar substances are optionally used as substrates for nanofiber growth/attachment.

As one example, the growth of nanofibers on a surface using a gold catalyst has been demonstrated in the literature. Applications targeted for such fibers are based on harvesting them from the substrate and then assembling them into devices. However, in many other embodiments herein, the nanofibers involved in enhanced surface areas are grown in place. Available methods, such as growing nanofibers from gold colloids deposited on surfaces are, thus, optionally used herein. The end product which results is the substrate upon which the fibers are grown (i.e., with an enhanced surface area due to the nanofibers). As will be appreciated, specific embodiments and uses herein, unless stated otherwise, can optionally comprise nanofibers grown in the place of their use and/or through nanofibers grown elsewhere, which are harvested and transferred to the place of their use. For example, many embodiments herein relate to leaving the fibers intact on the growth substrate and taking advantage of the unique properties the fibers impart on the substrate. Other embodiments relate to growth of fibers on a first substrate and transfer of the fibers to a second substrate to take advantage of the unique properties that the fibers impart on the second substrate.

For example, if nanofibers of the invention were grown on, e.g., a non-flexible substrate (e.g., such as some types of silicon wafers) they could be transferred from such non-flexible substrate to a flexible substrate (e.g., such as a conductive flexible metallic material). Again, as will be apparent to those of skill in the art, the nanofibers herein could optionally be grown on a flexible substrate to start with, but different desired parameters may influence such decisions.

A variety of methods may be employed in transferring nanofibers from a surface upon which they are fabricated to another surface. For example, nanofibers may be harvested into a liquid suspension, e.g., ethanol, which is then coated onto another surface. Additionally, nanofibers from a first surface (e.g., ones grown on the first surface or which have been transferred to the first surface) can optionally be "harvested" by applying a sticky coating or material to the nanofibers and then peeling such coating/material away from the first surface. The sticky coating/material is then optionally placed against a second surface to deposit the nanofibers. Examples of sticky coatings/materials which are optionally used for such transfer include, but are not limited to, e.g., tape (e.g., 3M Scotch® tape), magnetic strips, curing adhesives (e.g., epoxies, rubber cement, etc.), etc. The nanofibers could be removed from the growth substrate, mixed into a plastic, and then surface of such plastic could be ablated or etched away to expose the fibers.

The actual nanofiber constructions of the invention are optionally complex. For example, FIG. 3 is a photomicrograph of a typical nanofiber construction. As can be seen in FIG. 3, the nanofibers form a complex three-dimensional pattern. Possible interlacing and variable heights, curves, bends, etc. can form a surface which greatly increases the surface area per unit substrate (e.g., as compared with a planar surface without nanofibers). Of course, in other embodiments herein, it should be apparent that the nanofibers need not be as complex as, e.g., those shown in FIG. 3. Thus, in many embodiments herein, the nanofibers are "straight" and do not tend to bend, curve, or curl. However, such straight nanofibers are still encompassed within the current invention.

B) Functionalization

Some embodiments of the invention comprise nanofiber and nanofiber enhanced area surfaces in which the fibers include one or more functional moiety (e.g., a chemically reactive group) attached to them. Functionalized nanofibers are optionally used in many different embodiments, e.g., to confer increased electrical conductance to the nanofibers, to help the dielectric adhere/bond to the nanofibers, etc. Beneficially, typical embodiments of enhanced surface areas herein are comprised of silicon oxides, which are conveniently modified with a large variety of moieties. Of course, other embodiments herein are comprised of other nanofiber compositions (e.g., polymers, ceramics, metals that are coated by CVD or sol-gel sputtering, etc.) which are also optionally functionalized for specific purposes. Those of skill in the art will be familiar with numerous functionalizations and functionalization techniques which are optionally used herein.

Further relevant information can be found in CRC Handbook of Chemistry and Physics (2003) $83^{rd}$ edition by CRC Press. Details on conductive and other coatings, which can also be incorporated onto nanofibers of the invention by plasma methods and the like can be found in H. S. Nalwa (ed.), Handbook of Organic Conductive Molecules and Polymers, John Wiley & Sons 1997. See also, U.S. Pat. No. 6,949,206. Additionally, details regarding relevant moiety and other chemistries, as well as methods for construction/use of such, can be found, e.g., in Hermanson Bioconjugate Techniques Academic Press (1996), Kirk-Othmer Concise Encyclopedia of Chemical Technology (1999) Fourth Edition by Grayson et al. (ed.) John Wiley & Sons, Inc., New York and in Kirk-Othmer Encyclopedia of Chemical Technology Fourth Edition (1998 and 2000) by Grayson et al. (ed.) Wiley Interscience (print edition)/John Wiley & Sons, Inc. (e-format). Details regarding organic chemistry, relevant for, e.g., coupling of additional moieties to a functionalized surface of nanofibers can be found, e.g., in Greene (1981) Protective Groups in Organic Synthesis, John Wiley and Sons, New York, as well as in Schmidt (1996) Organic Chemistry Mosby, St Louis, Mo., and March's Advanced Organic Chemistry Reactions, Mechanisms and Structure, Fifth Edition (2000) Smith and March, Wiley Interscience New York ISBN 0-471-58589-0. Those of skill in the art will be familiar with many other related references and techniques amenable for functionalization of the nanofibers herein.

Thus, again as will be appreciated, the substrates involved, the nanofibers involved (e.g., attached to, or deposited upon, the substrates), and any optional functionalization of the nanofibers and/or substrates, and the like can be varied. For example, the length, diameter, conformation and density of the fibers can be varied, as can the composition of the fibers and their surface chemistry.

C) Density and Related Issues

In terms of density, it will be appreciated that by including more nanofibers emanating from a surface, one automatically increases the amount of surface area that is extended from the basic underlying substrate. This, thus, increases the amount of intimate contact area between the surface and the dielectric and, indirectly, to the opposing electrode plate coming into contact with the nanofiber surfaces. As explained in more detail below, the embodiments herein optionally comprise a density of nanofibers on a surface of from about 0.1 to about 1000 or more nanofibers per micrometer$_2$ of the substrate surface. Again, here too, it will be appreciated that such density depends upon factors such as the diameter of the individual nanofibers, etc. See, below. The nanofiber density influences the enhanced surface area, since a greater number of nanofibers will tend to increase the overall amount of area of the surface. Therefore, the density of the nanofibers herein typically has a bearing on the increased capacitance of the enhanced surface area materials because such density is a factor in the overall area of the surface.

For example, a typical flat planar substrate, e.g., a silicon oxide chip or a glass slide, will typically comprise "x" surface area per square micron (i.e., within a square micron footprint). However, if such a substrate surface were coated with nanofibers, then the available surface area would be much greater. In some embodiments herein each nanofiber on a surface comprises about 1 square micron in surface area (i.e., the sides and tip of each nanofiber present that much surface area). If a comparable square micron of substrate comprised from 10 to about 100 nanofibers per square micron, the available surface area is thus 10 to 100 times greater than a plain flat surface. Therefore, in the current illustration, an enhanced surface area would have 10× to 100× more surface area per square micron footprint. It will be appreciated that the density of nanofibers on a substrate is influenced by, e.g., the diameter of the nanofibers and any functionalization of such fibers, etc.

Different embodiments of the invention comprise a range of such different densities (i.e., number of nanofibers per unit area of a substrate to which nanofibers are attached). The number of nanofibers per unit area can optionally range from about 1 nanofiber per 10 micron$^2$ up to about 200 or more nanofibers per micron$^2$; from about 1 nanofiber per micron$^2$ up to about 150 or more nanofibers per micron$^2$; from about 10 nanofibers per micron$^2$ up to about 100 or more nanofibers per micron$^2$; or from about 25 nanofibers per micron$^2$ up to about 75 or more nanofibers per micron$^2$. In yet other embodiments, the density can optionally range from about 1 to 3 nanowires per square micron to up to approximately 2,500 or more nanowires per square micron.

In terms of individual fiber dimensions, it will be appreciated that by increasing the thickness or diameter of each individual fiber one will, again, automatically increase the overall area of the fiber and, thus, the overall area of the substrate and, hence, the electrode plate. The diameter of nanofibers herein can be controlled through, e.g., choice of compositions and growth conditions of the nanofibers, addition of moieties, coatings or the like, etc. Preferred fiber thicknesses are optionally between from about 5 nm up to about 1 micron or more (e.g., 5 microns); from about 10 nm to about 750 nanometers or more; from about 25 nm to about 500 nanometers or more; from about 50 nm to about 250 nanometers or more, or from about 75 nm to about 100 nanometers or more. In some embodiments, the nanofibers comprise a diameter of approximately 40 nm.

In addition to diameter, surface area of nanofibers (and therefore surface area of a substrate to which the nanofibers are attached and, thus, of the electrode plate) also is influenced by length of the nanofibers. Of course, it will also be understood that for some fiber materials, increasing length may yield increasing fragility. Accordingly, preferred fiber lengths will typically be between about 2 microns (e.g., 0.5 microns) up to about 1 mm or more; from about 10 microns to about 500 micrometers or more; from about 25 microns to about 250 microns or more; or from about 50 microns to about 100 microns or more. Some embodiments comprise nanofibers of approximately 50 microns in length. Some embodiments herein comprise nanofibers of approximately 40 nm in diameter and approximately 50 microns in length.

Nanofibers herein can present a variety of aspect ratios. Thus, nanofiber diameter can comprise, e.g., from about 5 nm up to about 1 micron or more (e.g., 5 microns); from about 10 nm to about 750 nanometers or more; from about 25 nm to about 500 nanometers or more; from about 50 nm to about 250 nanometers or more, or from about 75 nm to about 100 nanometers or more, while the lengths of such nanofibers can comprise, e.g., from about 2 microns (e.g., 0.5 microns) up to about 1 mm or more; from about 10 microns to about 500 micrometers or more; from about 25 microns to about 250 microns or more; or from about 50 microns to about 100 microns or more Fibers that are, at least in part, elevated above a surface are particularly preferred, e.g., where at least a portion of the fibers in the fiber surface are elevated at least 10 nm, or even at least 100 nm above a surface, in order to provide enhanced surface area available for coating with a dielectric and the opposing electrode plate.

Again, as seen in FIG. 3, the nanofibers optionally form a complex three-dimensional structure. The degree of such complexity depends in part upon, e.g., the length of the nanofibers, the diameter of the nanofibers, the length:diameter aspect ratio of the nanofibers, moieties (if any) attached to the nanofibers, and the growth conditions of the nanofibers, etc. The bending, interlacing, etc. of nanofibers, which help affect the degree of enhanced surface area available, are optionally manipulated through, e.g., control of the number of nanofibers per unit area as well as through the diameter of the nanofibers, the length and the composition of the nanofibers, etc. Thus, it will be appreciated that enhanced surface area of nanofiber substrates herein is optionally controlled through manipulation of these and other parameters.

Also, in some, but not all, embodiments herein, the nanofibers of the invention comprise bent, curved, or even curled forms. As can be appreciated, if a single nanofiber snakes or coils over a surface (but is still just a single fiber per unit area bound to a first surface), the fiber can still provide an enhanced surface area due to its length, etc.

D) Nanofiber Construction

As will be appreciated, the current invention is not limited by the means of construction of the nanofibers herein. For example, while some of the nanofibers herein are composed of silicon, the use of silicon should not be construed as necessarily limiting. For example, a number of other electrically conductive materials are optionally used. The formation of nanofibers is possible through a number of different approaches that are well known to those of skill in the art, all of which are amenable to embodiments of the current invention.

Typical embodiments herein can be used with existing methods of nanostructure fabrication, as will be known by those skilled in the art, as well as methods mentioned or described herein. In other words, a variety of methods for making nanofibers and nanofiber containing structures have been described and can be adapted for use in various embodiments of the invention.

The nanofibers can be fabricated of essentially any convenient electrically conductive material (e.g., a semiconducting material, a ferroelectric material, a metal, ceramic, polymers, etc.) and can comprise essentially a single material or can be heterostructures. For example, the nanofibers can comprise a semiconducting material, for example a material comprising a first element selected from group 2 or from group 12 of the periodic table and a second element selected from group 16 (e.g., ZnS, ZnO, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, and like materials); a material comprising a first element selected from group 13 and a second element selected from group 15 (e.g., GaN, GaP, GaAs, GaSb, InN, InP, InAs, InSb, and like materials); a material comprising a group 14 element (Ge, Si, and like materials); a material such as PbS, PbSe, PbTe, AlS, AlP, and AlSb; or an alloy or a mixture thereof.

In some embodiments herein, the nanofibers are optionally comprised of silicon or a silicon oxide. It will be understood by one of skill in the art that the term "silicon oxide" as used herein can be understood to refer to silicon at any level of oxidation. Thus, the term silicon oxide can refer to the chemical structure $SiO_x$, wherein x is between 0 and 2 inclusive. In other embodiments, the nanofibers can comprise, e.g., silicon, glass, quartz, plastic, metal, polymers, TiO, ZnO, ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, GaN, GaP, GaAs, GaSb, InN, InP, InAs, InSb, PbS, PbSe, PbTe, AlS, AlP, AlSb, $SiO_1$, $SiO_2$, silicon carbide, silicon nitride, polyacrylonitrile (PAN), polyetherketone, polyimide, aromatic polymers, or aliphatic polymers that are electrically conductive.

It will be appreciated that in some embodiments, the nanofibers can comprise the same material as one or more substrate surface (i.e., a surface to which the nanofibers are attached or associated), while in other embodiments, the nanofibers comprise a different material than the substrate surface. Additionally, the substrate surfaces can optionally comprise any one or more of the same materials or types of materials as do the nanofibers (e.g., such as the materials illustrated herein).

As previously stated, some, but by no means all, embodiments herein comprise silicon nanofibers. Common methods for making silicon nanofibers include vapor liquid solid growth (VLS), laser ablation (laser catalytic growth) and thermal evaporation. See, for example, Morales et al. (1998) "A Laser Ablation Method for the Synthesis of Crystalline Semiconductor Nanowires" Science 279, 208-211 (1998). In one example approach a hybrid pulsed laser ablation/chemical vapor deposition (PLA-CVD) process for the synthesis of semiconductor nanofibers with longitudinally ordered heterostructures, and variations thereof can be used. See, Wu et al. (2002) "Block-by-Block Growth of Single-Crystalline Si/SiGe Superlattice Nanowires," Nano Letters Vol. 0, No. 0.

In general, multiple methods of making nanofibers have been described and can be applied in the embodiments herein. In addition to Morales et al. and Wu et al. (above), see, for example, Lieber et al. (2001) "Carbide Nanomaterials" U.S. Pat. No. 6,190,634 B1; Lieber et al. (2000) "Nanometer Scale Microscopy Probes" U.S. Pat. No. 6,159,742; Lieber et al. (2000) "Method of Producing Metal Oxide Nanorods" U.S. Pat. No. 6,036,774; Lieber et al. (1999) "Metal Oxide Nanorods" U.S. Pat. No. 5,897,945; Lieber et al. (1999) "Preparation of Carbide Nanorods" U.S. Pat. No. 5,997,832; Lieber et al. (1998) "Covalent Carbon Nitride Material Comprising $C_2N$ and Formation Method" U.S. Pat. No. 5,840,435; Thess, et al. (1996) "Crystalline Ropes of Metallic Carbon Nanotubes" Science 273:483-486; Lieber et al. (1993) "Method of Making a Superconducting Fullerene Composition By Reacting a Fullerene with an Alloy Containing Alkali Metal" U.S. Pat. No. 5,196,396; and Lieber et al. (1993) "Machining Oxide Thin Films with an Atomic Force Microscope: Pattern and Object Formation on the Nanometer Scale" U.S. Pat. No. 5,252,835. One dimensional semiconductor heterostructure nanocrystals, have been described. See, e.g., Bjork et al. (2002) "One-dimensional Steeplechase for Electrons Realized" Nano Letters Vol. 0, No. 0.

It should be noted that some references herein, while not specific to nanofibers, are typically still applicable to the invention. For example, background issues of construction conditions and the like are applicable between nanofibers and other nanostructures (e.g., nanocrystals, etc.). Also, while described generally in terms of nanofibers and the like, again, it will be appreciated that nanospheres, nanocrystals, etc. are also optionally used to increase the surface area and capacitance of the embodiments herein. See above.

In another approach which is optionally used to construct nanofibers of the invention, synthetic procedures to prepare individual nanofibers on surfaces and in bulk are described, for example, by Kong, et al. (1998) "Synthesis of Individual Single-Walled Carbon Nanotubes on Patterned Silicon Wafers," Nature 395:878-881, and Kong, et al. (1998) "Chemical Vapor Deposition of Methane for Single-Walled Carbon Nanotubes," Chem. Phys. Lett. 292:567-574.

In yet another approach, substrates and self assembling monolayer (SAM) forming materials can be used, e.g., along with microcontact printing techniques to make nanofibers, such as those described by Schon, Meng, and Bao, "Self-assembled monolayer organic field-effect transistors," Nature 413:713 (2001); Zhou et al. (1997) "Nanoscale Metal/Self-Assembled Monolayer/Metal Heterostructures," Applied Physics Letters 71:611; and WO 96/29629 (Whitesides, et al., published Jun. 26, 1996).

In some embodiments herein, nanofibers can be synthesized using a metallic catalyst. A benefit of such embodiments allows use of unique materials suitable for surface modifications to create enhanced properties. A unique property of such nanofibers is that they are capped at one end with a catalyst, typically gold. This catalyst end can optionally be functionalized using, e.g., thiol chemistry without affecting the rest of the fiber, thus, making it capable of bonding to an appropriate surface. In such embodiments, the result of such functionalization, etc., is to make a surface with end-linked nanofibers. These resulting "fuzzy" surfaces, therefore, have increased surface areas (i.e., in relation to the surfaces without the nanofibers) and other unique properties. In some such embodiments, the surface of the nanofiber and/or the target substrate surface is optionally chemically modified (typically, but not necessarily, without affecting the gold tip) in order to give a wide range of properties useful in many applications.

In other embodiments, to increase or enhance a surface area, the nanofibers are optionally laid "flat" (i.e., substantially parallel to the substrate surface) by chemical or electrostatic interaction on surfaces, instead of end-linking the nanofibers to the substrate. In yet other embodiments herein, techniques involve coating the base surface with functional groups which repel the polarity on the nanofiber so that the fibers do not lay on the surface but are end-linked.

Synthesis of nanostructures, e.g., nanocrystals, of various composition is described in, e.g., Peng et al. (2000) "Shape control of CdSe nanocrystals" Nature 404:59-61; Puntes et al. (2001) "Colloidal nanocrystal shape and size control: The case of cobalt" Science 291:2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 5,505,928 to Alivisatos et al. (Apr. 9, 1996) entitled "Preparation of III-V semiconductor nanocrystals"; U.S. Pat. No. 5,751,018 to Alivisatos et al. (May 12, 1998) entitled "Semiconductor nanocrystals covalently bound to solid inorganic surfaces using self-assembled monolayers"; U.S. Pat. No. 6,048,616 to Gallagher et al. (Apr. 11, 2000) entitled "Encapsulated quantum sized doped semiconductor particles and method of manufacturing same"; and U.S. Pat. No. 5,990,479 to Weiss et al. (Nov. 23, 1999) entitled "Organo luminescent semiconductor nanocrystal probes for biological applications and process for making and using such probes."

Additional information on growth of nanofibers, such as nanowires, having various aspect ratios, including nanofibers with controlled diameters, is described in, e.g., Gudiksen et al. (2000) "Diameter-selective synthesis of semiconductor nanowires" J. Am. Chem. Soc. 122:8801-8802; Cui et al. (2001) "Diameter-controlled synthesis of single-crystal silicon nanowires" Appl. Phys. Lett. 78:2214-2216; Gudiksen et al. (2001) "Synthetic control of the diameter and length of single crystal semiconductor nanowires" J. Phys. Chem. B 105:4062-4064; Morales et al. (1998) "A laser ablation method for the synthesis of crystalline semiconductor nanowires" *Science* 279:208-211; Duan et al. (2000) "General synthesis of compound semiconductor nanowires" *Adv. Mater.* 12:298-302; Cui et al. (2000) "Doping and electrical transport in silicon nanowires" *J. Phys. Chem. B* 104:5213-5216; Peng et al. (2000), supra; Puntes et al. (2001), supra; U.S. Pat. No. 6,225,198 to Alivisatos et al., supra; U.S. Pat. No. 6,036,774 to Lieber et al. (Mar. 14, 2000) entitled "Method of producing metal oxide nanorods"; U.S. Pat. No. 5,897,945 to Lieber et al. (Apr. 27, 1999) entitled "Metal oxide nanorods"; U.S. Pat. No. 5,997,832 to Lieber et al. (Dec. 7, 1999) "Preparation of carbide nanorods"; Urbau et al. (2002) "Synthesis of single-crystalline perovskite nanowires composed of barium titanate and strontium titanate" *J. Am. Chem. Soc.*, 124:1186; Yun et al. (2002) "Ferroelectric Properties of Individual Barium Titanate Nanowires Investigated by Scanned Probe Microscopy" *Nano Letters* 2, 447; and published PCT application nos. WO 02/17362, and WO 02/080280.

Growth of branched nanofibers (e.g., nanotetrapods, tripods, bipods, and branched tetrapods) is described in, e.g., Jun et al. (2001) "Controlled synthesis of multi-armed CdS nanorod architectures using monosurfactant system" *J. Am. Chem. Soc.* 123:5150-5151; and Manna et al. (2000) "Synthesis of Soluble and Processable Rod-, Arrow-, Teardrop-, and Tetrapod-Shaped CdSe Nanocrystals" *J. Am. Chem. Soc.* 122:12700-12706. Synthesis of nanoparticles is described in, e.g., U.S. Pat. No. 5,690,807 to Clark Jr. et al. (Nov. 25, 1997) entitled "Method for producing semiconductor particles"; U.S. Pat. No. 6,136,156 to El-Shall, et al. (Oct. 24, 2000) entitled "Nanoparticles of silicon oxide alloys"; U.S. Pat. No. 6,413,489 to Ying et al. (Jul. 2, 2002) entitled "Synthesis of nanometer-sized particles by reverse micelle mediated techniques"; and Liu et al. (2001) "Sol-Gel Synthesis of Free-Standing Ferroelectric Lead Zirconate Titanate Nanoparticles" *J. Am. Chem. Soc.* 123:4344. Synthesis of nanoparticles is also described in the above citations for growth of nanocrystals, and nanofibers such as nanowires, branched nanowires, etc.

Synthesis of core-shell nanofibers, e.g., nanostructure heterostructures, is described in, e.g., Peng et al. (1997) "Epitaxial growth of highly luminescent CdSe/CdS core/shell nanocrystals with photostability and electronic accessibility" *J. Am. Chem. Soc.* 119:7019-7029; Dabbousi et al. (1997) "(CdSe)ZnS core-shell quantum dots: Synthesis and characterization of a size series of highly luminescent nanocrystallites" *J. Phys. Chem. B* 101:9463-9475; Manna et al. (2002) "Epitaxial growth and photochemical annealing of graded CdS/ZnS shells on colloidal CdSe nanorods" *J. Am. Chem. Soc.* 124:7136-7145; and Cao et al. (2000) "Growth and properties of semiconductor core/shell nanocrystals with InAs cores" *J. Am. Chem. Soc.* 122:9692-9702. Similar approaches can be applied to growth of other core-shell nanostructures. See, for example, U.S. Pat. No. 6,207,229 (Mar. 27, 2001) and U.S. Pat. No. 6,322,901 (Nov. 27, 2001) to Bawendi et al. entitled "Highly luminescent color-selective materials."

Growth of homogeneous populations of nanofibers, including nanofiber heterostructures in which different materials are distributed at different locations along the long axis of the nanofibers is described in, e.g., published PCT application numbers WO 02/17362, and WO 02/080280; Gudiksen et al. (2002) "Growth of nanowire superlattice structures for nanoscale photonics and electronics" *Nature* 415:617-620; Bjork et al. (2002) "One-dimensional steeplechase for electrons realized" *Nano Letters* 2:86-90; Wu et al. (2002) "Block-by-block growth of single-crystalline Si/SiGe superlattice nanowires" *Nano Letters* 2, 83-86; and US patent application publication 2004/0026684. Similar approaches can be applied to growth of other heterostructures and applied to the various devices, methods and systems herein.

In some embodiments the nanofibers used to create enhanced surface areas can be comprised of nitride (e.g., AlN, GaN, SiN, BN) or carbide (e.g., SiC, TiC, Tungsten carbide, boron carbide) in order to create nanofibers with high strength and durability. Alternatively, such nitrides/carbides are used as hard coatings on lower strength (e.g., silicon or ZnO) nanofibers. While the dimensions of silicon nanofibers are excellent for many applications requiring enhanced surface area (e.g., see, throughout and US patent application publication 20040206448.) other capacitor applications can require nanofibers that are less brittle and which break less easily. Therefore, some embodiments herein take advantage of materials such as nitrides and carbides which have higher bond strengths than, e.g., Si, $SiO_2$ or ZnO. The nitrides and carbides are optionally used as coatings to strengthen the weaker nanofibers or even as nanofibers themselves.

Carbides and nitrides can be applied as coatings to low strength fibers by deposition techniques such as sputtering and plasma processes. In some embodiments, to achieve high strength nanocoatings of carbide and nitride coatings, a random grain orientation and/or amorphous phase is grown to avoid crack propagation. Optimum conformal coating of the nanofibers can optionally be achieved if the fibers are growing perpendicular to a substrate surface. The hard coating for fibers in such orientation also acts to enhance the adhesion of the fibers to the substrate. For fibers that are randomly oriented, the coating is preferential to the upper layer of fibers. Further information on coating nanostructure surfaces (e.g., to deposit a dielectric layer or to construct a second electrode plate) is presented herein.

Low temperature processes for creation of silicon nanofibers are achieved by the decomposition of silane at about 400° C. in the presence of a gold catalyst. However, as previously stated, silicon nanofibers can be too brittle for some applications to form a durable nanofiber matrix (i.e., an enhanced surface area). Thus, formation and use of, e.g., SiN is optionally utilized in some embodiments herein. In those embodiments, $NH_3$, which has decomposition at about 300° C., is used to combine with silane to form SiN nanofibers (also by using a gold catalyst). Other catalytic surfaces to form such nanofibers can include, e.g., Ti, Fe, etc.

Forming carbide and nitride nanofibers directly from a melt can sometimes be challenging since the temperature of the liquid phase is typically greater than 1000° C. However, a nanofiber can be grown by combining the metal component with the vapor phase. For example, GaN and SiC nanofibers have been grown (see, e.g., Peidong, Lieber, supra) by exposing Ga melt to $NH_3$ (for GaN) and graphite with silane (SiC). Similar concepts are optionally used to form other types of carbide and nitride nanofibers by combing metal-organic vapor species, e.g., tungsten carbolic [W(CO)6] on a carbon surface to form tungsten carbide (WC), or titanium dimethoxy dineodecanoate on a carbon surface to form TiC. It will be appreciated that in such embodiments, the temperature, pressure, power of the sputtering and the CVD process are all optionally varied depending upon, e.g., the specific parameters desired in the end nanofibers. Additionally, several types of metal organic precursors and catalytic surfaces used to form the nanofibers, as well as, the core materials for the nanofibers (e.g., Si, ZnO, etc.) and the substrates containing the nanofibers, are all also variable from one embodiment to another depending upon, e.g., the specific enhanced nanofiber surface area capacitor to be constructed.

The present invention can be used with structures that may fall outside of the size range of typical nanostructures. For example, Haraguchi et al. (U.S. Pat. No. 5,332,910) describes nanowhiskers which are optionally used herein in design and construction of capacitors. Semi-conductor whiskers are also described by Haraguchi et al. (1994) "Polarization Dependence of Light Emitted from GaAs p-n junctions in quantum wire crystals" *J. Appl. Phys.* 75(8):4220-4225; Hiruma et al. (1993) "GaAs Free Standing Quantum Sized Wires," *J. Appl. Phys.* 74(5):3162-3171; Haraguchi et al. (1996) "Self Organized Fabrication of Planar GaAs Nanowhisker Arrays"; and Yazawa (1993) "Semiconductor Nanowhiskers" *Adv. Mater.* 5(78):577-579. Such nanowhiskers are optionally nanofibers of the invention. While the above references (and other references herein) are optionally used for construction and determination of parameters of nanofibers of the invention, those of skill in the art will be familiar with other methods of nanofiber construction/design, etc. which can also be amenable to the methods and devices herein.

Some embodiments herein comprise methods for improving the density and control of nanowire growth as is relates to generating a nanostructured surface coating of substrates. Such methods include repetitive cycling of nanofiber synthesis and gold fill deposition to make "nano-trees" as well as the co-evaporation of material that will not form a silicon eutectic, thus, disrupting nucleation and causing smaller wire formation Such methods are utilized in the creation of ultra-high capacity surface based structures through nanofiber growth technology for, e.g., nanofiber based capacitors. Use of single-step metal film type process in creation of nanofibers limits the ability to control the starting metal film thickness, surface roughness, etc., and, thus, the ability of control nucleation from the surface.

In some embodiments of nanofiber enhanced surfaces it can be desirable to produce multibranched nanofibers. Such multibranched nanofibers could allow an even greater increase in surface area than would occur with non-branched nanofiber surfaces. To produce multibranched nanofibers gold film is optionally deposited onto a nanofiber surface (i.e., one that has already grown nanofibers). When placed in a furnace, fibers perpendicular to the original growth direction can result, thus, generating branches on the original nanofibers. Colloidal metal particles can optionally be used instead of gold film to give greater control of the nucleation and branch formation. The cycle of branching optionally could be repeated multiple times to generate additional branches. Eventually, the branches between adjacent nanofibers could optionally touch and generate an interconnected network. Sintering is optionally used to improve the binding of the fine branches.

In yet other capacitor embodiments, it is desirable to form finer nanofibers (e.g., nanowires). To accomplish this, some embodiments herein optionally use a non-alloy forming material during gold or other alloy forming metal evaporation. Such material, when introduced in a small percentage can optionally disrupt the metal film to allow it to form smaller droplets during wire growth and, thus, correspondingly finer fibers.

In yet other embodiments, post processing steps such as vapor deposition of materials can allow for greater anchoring or mechanical adhesion and interconnection between nanofibers, thus, improving mechanical robustness in applications requiring additional strength as well as increasing the overall surface to volume of the nanostructure surface. Additionally, typical embodiments herein have deposition of material(s) to form the dielectric.

It should be appreciated that specific embodiments and illustrations herein of uses or devices, etc., which comprise nanofiber enhanced surface area capacitors should not be construed as necessarily limiting. In other words, the current invention is illustrated by the descriptions herein, but is not constrained by individual specifics of the descriptions unless specifically stated. The embodiments are illustrative of various uses/applications of the enhanced surface area nanofiber surface capacitors and constructs thereof. Again, the enumeration of specific embodiments herein is not to be taken as necessarily limiting on other uses/applications which comprise the enhanced surface area nanofiber structures of the current invention.

In some embodiments, the invention comprises methods to selectively modify or create enhanced surface area substrates as well as such enhanced substrates themselves and capacitor devices comprising the same. As will be appreciated, and as is described herein, such methods and devices are applicable to a wide range of uses and can be created in any of a number of ways (several of which are illustrated herein).

As will be appreciated, the enhanced surface areas provided by surfaces containing nanofibers can provide significant advantages as an integral part of a capacitor. However, in some embodiments, e.g., in manufacturing or as required by some devices, multiple capacitors or multiple nanofiber areas to be incorporated into capacitors are created on the same substrate. Therefore, some embodiments herein comprise methods that can allow spatially controlled chemistry to be applied to nanofiber-enhanced surfaces (e.g., application of dielectric material(s) and/or material(s) to comprise an opposing electrode plate, etc.), and/or to spatially control the placement of the nanofibers themselves upon the substrate. Such control can facilitate the utility of enhanced nanofiber surfaces in real applications.

Several approaches are included in the embodiments herein for selectively patterning areas of nanofiber growth or placement on substrates so as to generate spatially defined regions to which to apply specific chemistry (e.g., dielectric deposition). In such approaches, the term "substrate" relates to the material upon which the wires are grown (or, in some embodiments, placed or deposited). In different situations, substrates are optionally comprised of, e.g., silicon wafer, glass, quartz, or any other material appropriate for VLS based nanowire growth or the like. However, in typical embodiments wherein the nanofibers are to be used in situ, the substrate is preferably electrically conductive.

In some embodiments herein, micro-patterning of enhanced surface area substrates is optionally created by lithographically applying planar regions of gold to a substrate as the standard growth initiator through use of conventional lithographic approaches which are well known to those of skill in the art. Nanofibers (e.g., VLS nanowires) are then grown, e.g., in the manner of Peidong Yang, *Advanced Materials*, Vol. 13, No. 2, January 2001.

In other embodiments, patterning can be created by chemically precoating a substrate through conventional lithographic approaches so that deposition of gold colloids is controlled prior to growth of nanofibers (e.g., by selective patterning of thiol groups on the substrate surface). In yet other embodiments, nanofibers are optionally pre-grown in a conventional manner well known to those of skill in the art (see, e.g., above) and then selectively attached to regions of the substrate where the spatially defined pattern is required. Of course, in yet other embodiments, "lawns" of nanofibers forming an enhanced surface area substrate are selectively patterned through removal of nanofibers in preselected areas. Other embodiments can optionally comprise nanofiber lawns that have areas selectively cleared of nanofibers (thus, creating nanofiber islands, etc.) or can have nanofibers only grown or deposited in certain selected areas (or any combinations thereof). Those of skill in the art will be aware of numerous other patterns, etc. which can optionally be within embodiments herein.

While, certain methods of patterning, substrate/nanofiber/dielectric/etc. composition and the like are illustrated herein, it will again be appreciated that such are illustrative of the range included in the invention. Thus, such parameters can be changed and still come within the range of the invention. For example, as illustrated above, creation of enhanced surface areas is optionally accomplished in any of a number of ways, all of which are encompassed herein. For example, as described in greater detail in co-pending and commonly assigned U.S. patent application Ser. No. 60/611,116 entitled "Nanostructured Thin Films and Their Uses," filed Sep. 17, 2004, the entire contents of which are incorporated by reference herein, nanostructured surfaces can be made from a variety of materials including insulating inorganic materials such as a native oxide layer or a deposited oxide or nitride layer. The insulating inorganic material may also be formed form a deposited metal layer. For example, the insulating inorganic material may be selected from the group of materials including aluminum (Al), alumina ($Al_2O_3$), ZnO, $SiO_2$, $ZrO_2$, $HfO_2$, a hydrous form of these oxides, a compound oxide such as $SiTiO_3$, $BaTiO_3$ $PbZrO_4$ or a silicate. In one example, the film layer is made from alumina or aluminum which can be deposited on the substrate (e.g., one or more electrode plates) using a variety of well-known techniques such as thermal evaporation and sputtering including physical vapor deposition (PVD), sputter deposition, chemical vapor deposition (CVD), metallorganic CVD, plasma-enhanced CVD, laser ablation, or solution deposition methods such as spray coating, dip coating, or spin coating etc. Ultra-thin metal films (e.g., films less than about 5 nm in thickness) may be deposited by atomic layer deposition (ALD) techniques. The thin film preferably has a thickness less than about 1000 nm, for example, between about 5 and 400 nm, for example, between about 5 and 200 nm, for example, between about 10 and 100 nm. The film layer may then be configured to have a nanostructured surface, for example, by boiling the film layer, autoclaving it, etc. for a sufficient time (e.g., between about 3 to 60 minutes, for example, between about 5 to 30 minutes) to convert the film into a highly ordered nanostructured surface having pore sizes less than about 200 nm. The nanostructured film layer can also be formed by other means such as the formation of porous alumina films via the anodization of aluminum metal in acidic solution (e.g., phosphoric, oxalic, or sulfuric acid solutions). See, e.g., Evelina Palibroda, A. Lupsan, Stela Pruneanu, M. Savos, *Thin Solid Films*, 256, 101 (1995), the entire contents of which are incorporated by reference herein. Other textured surfaces other than alumina or aluminum can also be used including, for example, zinc oxide (ZnO) nanostructured surfaces and the other material surfaces described above. Low-temperature solution-based approaches to forming ZnO nanotextured surfaces are described, for example, in "Low Temperature Wafer-Scale Production of ZnO Nanowire Arrays," Lori E. Greene et al., *Angew. Chem. Int. Ed.* 2003, 42, 3031-3034, the entire contents of which are incorporated by reference herein.

The nanostructured film layer can also optionally be coated or functionalized, e.g., to enhance or add specific properties. For example, polymers, ceramics, or small molecules can optionally be used as coating materials. The optional coatings can impart characteristics such as water resistance, improved mechanical, optical (e.g., enhancement of light coupling) or electrical properties. The nanostructured film layer may also be derivatized with one or more functional moieties (e.g., a chemically reactive group) such as one or more silane groups, e.g., one or more perfluorinated silane groups, or other coatings such as diamond coatings, a hydrocarbon molecule, a fluorocarbon molecule, or a short chain polymer of both types of molecules which may be attached to the film layer via silane chemistry. Those of skill in the art will be familiar with numerous functionalizations and functionalization techniques which are optionally used herein (e.g., similar to those used in construction of separation columns, bio-assays, etc.).

For example, details regarding relevant moiety and other chemistries, as well as methods for construction/use of such, can be found, e.g., in Hermanson *Bioconjugate Techniques* Academic Press (1996), Kirk-Othmer *Concise Encyclopedia of Chemical Technology* (1999) Fourth Edition by Grayson et al. (ed.) John Wiley & Sons, Inc., New York and in Kirk-Othmer *Encyclopedia of Chemical Technology* Fourth Edition (1998 and 2000) by Grayson et al. (ed.) Wiley Interscience (print edition)/John Wiley & Sons, Inc. (e-format). Further relevant information can be found in *CRC Handbook of Chemistry and Physics* (2003) $83^{rd}$ edition by CRC Press. Details on conductive and other coatings, which can also be incorporated onto the nanostructured film layer of the invention by plasma methods and the like can be found in H. S. Nalwa (ed.), *Handbook of Organic Conductive Molecules and Polymers*, John Wiley & Sons 1997. See also, U.S. Pat. No. 6,949,206. Details regarding organic chemistry, relevant for, e.g., coupling of additional moieties to a functionalized surface can be found, e.g., in Greene (1981) *Protective Groups in Organic Synthesis*, John Wiley and Sons, New York, as well as in Schmidt (1996) *Organic Chemistry Mosby*, St Louis, Mo., and March's *Advanced Organic Chemistry Reactions, Mechanisms and Structure*, Fifth Edition (2000) Smith and March, Wiley Interscience New York ISBN 0-471-58589-0, and U.S. patent application publication 2005/0181195. Those of skill in the art will be familiar with many other related references and techniques amenable for functionalization of surfaces herein.

While the foregoing invention has been described in some detail for purposes of clarity and understanding, it will be clear to one skilled in the art from a reading of this disclosure that various changes in form and detail can be made without departing from the true scope of the invention. For example, all the techniques and apparatus described above can be used in various combinations. All publications, patents, patent applications, or other documents cited in this application are incorporated by reference in their entirety for all purposes to the same extent as if each individual publication, patent, patent application, or other document were individually indicated to be incorporated by reference for all purposes.

What is claimed is:

1. A capacitor comprising first and second opposing electrodes and a dielectric layer disposed between the first and second electrodes, wherein the dielectric layer comprises a plurality of inorganic nanofibers and a dielectric which covers substantially all members of the plurality of nanofibers.

2. The capacitor of claim 1, wherein the plurality of nanofibers comprises silicon or a silicon containing compound.

3. The capacitor of claim 1, wherein the dielectric comprises a nonconductive material.

4. The capacitor of claim 1, wherein the dielectric comprises an oxide, a nitride, a polymer, a ceramic, a resin, a porcelain, a mica containing material, a glass, a rare earth oxide, or a gas.

5. The capacitor of claim 1, wherein the dielectric comprises a grown oxide layer.

6. The capacitor of claim 1, wherein the dielectric comprises a naturally occurring oxide layer.

7. The capacitor of claim 1, wherein the dielectric comprises silicon oxide.

8. The capacitor of claim 5, wherein the oxide layer comprises a thickness of from about 1 nm or less to about 1 um, from about 2 nm or less to about 750 nm, from about 5 nm or less to about 500 nm, from about 10 nm or less to about 250 nm, or from about 50 nm or less to about 100 um.

9. The capacitor of claim 1, wherein the plurality of nanofibers comprise a plurality of nanowires.

10. The capacitor of claim 9, wherein the plurality of nanowires comprise a silicon or silicon containing compound.

11. The capacitor of claim 10, wherein the nanowires are coated with one or more functional moeites selected from the group comprising a small molecule, a polymer, or a ceramic.

12. The capacitor of claim 1, wherein the plurality of nanofibers are grown on a surface of at least one of said first and second electrodes.

13. The capacitor of claim 1, wherein the plurality of nanofibers are deposited on a surface of at least one of said first and second electrodes.

14. The capacitor of claim 12, wherein the plurality of nanofibers are grown by a VLS growth process.

* * * * *